United States Patent
Miyatake et al.

(10) Patent No.: US 8,735,733 B2
(45) Date of Patent: May 27, 2014

(54) RESIN COMPOSITION, PREPREG LAMINATE OBTAINED WITH THE SAME AND PRINTED-WIRING BOARD

(75) Inventors: Masato Miyatake, Ibaraki (JP); Tomohiko Kotake, Ibaraki (JP); Shunsuke Nagai, Ibaraki (JP); Shintaro Hashimoto, Ibaraki (JP); Yasuo Inoue, Ibaraki (JP); Shin Takanezawa, Ibaraki (JP); Hikari Murai, Ibaraki (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 13/352,819

(22) Filed: Jan. 18, 2012

(65) Prior Publication Data

US 2012/0247820 A1  Oct. 4, 2012

Related U.S. Application Data

(60) Provisional application No. 61/433,739, filed on Jan. 18, 2011.

(51) Int. Cl.
*E04B 1/78* (2006.01)
*B32B 27/04* (2006.01)
*B32B 27/34* (2006.01)
*H05K 1/00* (2006.01)

(52) U.S. Cl.
USPC ............. 174/258; 252/62; 442/147; 428/458

(58) Field of Classification Search
None
See application file for complete search history.

(56) References Cited

U.S. PATENT DOCUMENTS

| | | | | | |
|---|---|---|---|---|---|
| 3,763,081 | A | * | 10/1973 | Holub et al. | 524/404 |
| 4,238,591 | A | * | 12/1980 | Cassat et al. | 528/27 |
| 4,544,728 | A | * | 10/1985 | Dien et al. | 528/21 |
| 4,847,154 | A | * | 7/1989 | Ryang | 428/415 |
| 4,980,427 | A | * | 12/1990 | Ryang | 525/479 |
| 5,134,421 | A | * | 7/1992 | Boyd et al. | 343/872 |
| 5,164,463 | A | * | 11/1992 | Ho et al. | 525/530 |
| 5,252,687 | A | * | 10/1993 | Shiomi et al. | 525/502 |
| 5,508,357 | A | * | 4/1996 | Matsuura et al. | 525/420 |
| 6,027,794 | A | * | 2/2000 | Ozaki et al. | 428/297.7 |
| 2008/0268237 | A1 | * | 10/2008 | Yonezawa et al. | 428/336 |
| 2010/0143728 | A1 | * | 6/2010 | Tsuchikawa et al. | 428/457 |
| 2012/0077401 | A1 | * | 3/2012 | Kotake et al. | 442/147 |

FOREIGN PATENT DOCUMENTS

WO  WO 2010110433 A1 * 9/2010 ............... H05K 1/03

* cited by examiner

*Primary Examiner* — Robert S Loewe
(74) *Attorney, Agent, or Firm* — Antonelli, Terry, Stout & Kraus, LLP.

(57) ABSTRACT

Disclosed are a resin composition containing (a) a maleimide compound having at least two N-substituted maleimide groups in a molecular structure and (b) a silicone compound having at least one reactive organic group in a molecular structure thereof; and a prepreg using the same, a laminate, and a printed wiring board.

A resin composition having excellent heat resistance and low thermal expansion properties; and a prepreg, a laminate, and a printed wiring board using the same can be provided.

16 Claims, No Drawings

RESIN COMPOSITION, PREPREG LAMINATE OBTAINED WITH THE SAME AND PRINTED-WIRING BOARD

This application claims the right of priority under 35 USC 119(e) based upon prior U.S. Provisional Pat Application Ser. No. 61/433,739, filed Jan. 18, 2011.

TECHNICAL FIELD

The present invention relates to a resin composition having insulating properties, heat resistance, and the like and also having especially excellent low thermal expansion properties, which is used for electronic components and so on, and to a prepreg using the same, a laminate, and a printed wiring board.

BACKGROUND ART

Associated with a trend toward miniaturization and high performance of electronic devices in recent years, in printed wiring boards, density growth and high integration of the wiring density is developed. Along with this, there is an increased demand for enhancement of reliability by increasing the heat resistance of laminates for wiring. In such an application, it is demanded to have an excellent heat resistance and also a low coefficient of thermal expansion.

A laminate for printed wiring board is generally formed by curing and integrally molding a resin composition containing an epoxy resin as a major ingredient with a glass woven fabric. In general, the epoxy resin is excellent in a balance among insulating properties, heat resistance, costs and the like. However, in order to comply with a demand for an enhancement of heat resistance accompanied with high-density mounting and multi-layer configuration of a printed wiring board in recent years, there is a limit in an increase of the heat resistance, inevitably. Furthermore, since the epoxy resin has a large coefficient of thermal expansion, it is attempted to reduce the thermal expansion by selecting an epoxy resin having an aromatic ring or filling an inorganic filler such as silica in a high density (see, for example, Patent Document 1).

In particular in recent years, in a package substrate for semiconductors, associated with miniaturization and thinning, a warpage resulting from a difference in the thermal expansion coefficient between a chip and a substrate is a large problem at the time of component mounting or package assembling. Therefore, it is required that the thermal expansion should be reduced. However, it is known that an increase of the filling amount of the inorganic filler causes a lowering of insulation reliability resulting from moisture absorption, an insufficient adhesive force between the resin composition layer and the wiring layer, and a failure of press molding.

Although a polybismaleimide resin which is widely used for high-density mounting or highly multi-layered laminate is very excellent in the heat resistance, it has high moisture absorption and a problem with the adhesion. Furthermore, as compared with an epoxy resin, the polybismaleimide resin requires a high temperature and a long time at the time of lamination, so that it has a drawback that the productivity is poor.

That is, in the case of the epoxy resin, it can be generally cured at a temperature of 180° C. or less, whereas in the case of laminating the polybismaleimide resin, a long-term treatment at a high temperature of 220° C. or higher is required. Also, a modified imide resin composition is improved in moisture resistance and adhesion (see, for example, Patent Document 2); however, since it is modified with a low-molecular weight compound containing a hydroxyl group and an epoxy group for the purpose of ensuring solubility in commonly-used solvent such as methyl ethyl ketone, the resulting modified imide resin is significantly inferior in the heat resistance to the polybismaleimide resin.

PRIOR ART DOCUMENTS

Patent Documents

[Patent Document 1] JP-A-5-148343
[Patent Document 2] JP-A-6-263843

SUMMARY OF THE INVENTION

Problems to be Solved by the Invention

In view of the above existing circumstance, an object of the present invention is to provide a resin composition which is especially excellent in heat resistance and low thermal expansion properties, and a prepreg using the same, a laminate and a printed wiring board.

Means for Solving the Problems

In order to achieve the above object, the present inventors made extensive and intensive investigations. As a result, it has been found that a resin composition comprising a polybismaleimide resin and a silicone resin having a reactive organic group satisfies the above object.

That is, the present invention provides a resin composition, a prepreg, a laminate, and a printed wiring board as described below.

(1) A resin composition comprising (a) a maleimide compound having at least two N-substituted maleimide groups in a molecular structure and (b) a silicone compound having at least one reactive organic group in a molecular structure;

(2) The resin composition according to (1), further comprising (c) a thermosetting resin;

(3) The resin composition according to (1) or (2), further comprising (d) an amine compound having an acidic substituent represented by the following general formula (I):

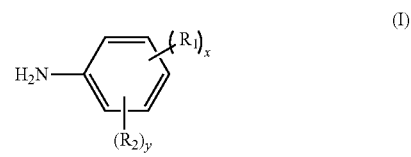

wherein when a plurality of $R_1$s are present, each $R_1$ independently represents a hydroxyl group, a carboxyl group, or a sulfonic acid group as an acidic substituent; when a plurality of $R_2$s are present, each $R_2$ represents a hydrogen atom, an aliphatic hydrocarbon group having a carbon number of 1 to 5, or a halogen atom; x represents an integer of 1 to 5 and y represents an integer of 0 to 4, with the proviso that $x+y=5$;

(4) The resin composition according to any of (1) to (3), wherein the component (b) is a silicone compound containing a structure represented by the following general formula (II):

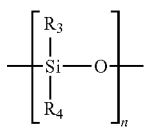

wherein each of $R_3$ and $R_4$ independently represents an alkyl group, a phenyl group, or a substituted phenyl group; and n represents an integer of 1 to 100;

(5) The resin composition according to any of (1) to (4), wherein the reactive organic group of the component (b) is at least one selected from an epoxy group, an amino group, a hydroxyl group, a methacryl group, a mercapto group, a carboxyl group, and an alkoxy group;

(6) The resin composition according to any of (1) to (5), wherein the component (b) is a silicone compound having at least two reactive organic groups in a molecular structure;

(7) The resin composition according to any of (1) to (5), wherein the component (b) is a silicone compound having a reactive organic group on both ends;

(8) The resin composition according to any of (1) to (5), wherein the component (b) is a silicone compound having a reactive organic group on either end;

(9) The resin composition according to any of (1) to (5), wherein the component (b) is a silicone compound having a reactive organic group in the side chain;

(10) The resin composition according to any of (1) to (5), wherein the component (b) is a silicone compound having a reactive organic group in the side chain and on at least one end;

(11) The resin composition according to any of (1) to (10), wherein the component (c) is a thermosetting resin having an epoxy group and/or a cyanate group in a molecular structure;

(12) The resin composition according to any of (1) to (11), further comprising (e) a curing accelerator represented by the following formula (III) or (IV):

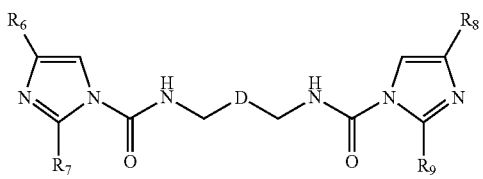

wherein each of $R_6$, $R_7$, $R_8$, and $R_9$ independently represents a hydrogen atom, an aliphatic hydrocarbon group having a carbon number of 1 to 5, or a phenyl group; and D represents an alkylene group or an aromatic hydrocarbon group, wherein each of $R_6$, $R_7$, $R_8$, and $R_9$ independently represents a hydrogen atom, an aliphatic hydrocarbon group having a carbon number of 1 to 5, or a phenyl group; and B represents single bond or any one of an alkylene group, an alkylidene group, an ether group, and a sulfonyl group;

(13) The resin composition according to any (1) to (12), further comprising (f) an inorganic filler;

(14) A prepreg using the resin composition according to any (1) to (13);

(15) A laminate obtained by laminating and molding the prepreg according to (14);

(16) A printed wiring board manufactured by using the laminate according to (15).

Effects of the Invention

A prepreg obtained by impregnating or coating a substrate with a resin composition of the present invention, a laminate manufactured by laminating and molding the prepreg, and a multilayer printed wiring board manufactured by using the laminate are excellent in glass transition temperature, coefficient of thermal expansion, solder dip resistance, and warpage characteristics, and are useful as a printed wiring boar for electronic devices.

MODES FOR CARRYING OUT THE INVENTION

The present invention is described in detail below. The present invention is concerned with a resin composition comprising (a) a maleimide compound having at least two N-substituted maleimide groups in a molecular structure thereof and (b) a silicone compound having at least one reactive organic group in a molecular structure.

Examples of the maleimide compound having at least two N-substituted maleimide groups in a molecule as the component (a) in the resin composition of the present invention include N,N'-ethylenebismaleimide, N,N'-hexamethylenebismaleimide, N,N'-(1,3-phenylene)bismaleimide, N,N'-[1,3-(2-methylphenylene)]bismaleimide, N,N'-[1,3-(4-methylphenylene)]bismaleimide, N,N'-(1,4-phenylene)bismaleimide, bis(4-maleimidophenyl)methane, bis(3-methyl-4-maleimidophenyl)methane, 3,3-dimethyl-5,5-diethyl-4,4-diphenylmethanebismaleimide, bis(4-maleimidophenyl)ether, bis(4-maleimidophenyl)sulfone, bis(4-maleimidophenyl)sulfide, bis(4-maleimidophenyl)ketone, bis(4-maleimidocyclohexyl)methane, 1,4-bis(4-maleimidophenyl)cyclohexane, 1,4-bis(maleimidomethyl)cyclohexane, 1,4-bis(maleimidomethyl)benzene, 1,3-bis(4-maleimidophenoxy)benzene, 1,3-bis(3-maleimidophenoxy)benzene, bis[4-(3-maleimidophenoxy)phenyl]methane, bis[4-(4-maleimidophenoxy)phenyl]methane, 1,1-bis[4-(3-maleimidopenoxy)phenyl]ethane, 1,1-bis[4-(4-maleimidophenoxy)phenyl]ethane, 1,2-bis[4-(3-maleimidophenoxy)phenyl]ethane, 1,2-bis[4-(4-maleimidophenoxy)phenyl]ethane, 2,2-bis[4-(3-

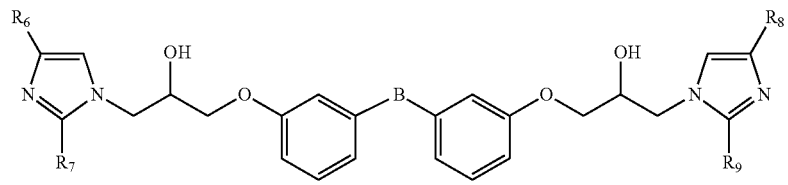

maleimidophenoxy)phenyl]propane, 2,2-bis[4-(4-maleimidophenoxy)phenyl]propane, 2,2-bis[4-(3-maleimidophenoxy)phenyl]butane, 2,2-bis[4-(4-maleimidophenoxy)phenyl]butane, 2,2-bis[4-(3-maleimidophenoxy)phenyl]-1,1,1,3,3,3-hexafluoropropane, 2,2-bis[4-(4-maleimidophenoxy)phenyl]-1,1,1,3,3,3-hexafluoropropane, 4,4-bis(3-maleimidophenoxy)biphenyl, 4,4-bis(4-maleimidophenoxy)biphenyl, bis[4-(3-maleimidophenoxy)phenyl]ketone, bis[4-(4-maleimidophenoxy)phenyl]ketone, 2,2-bis(4-maleimidophenyl)disulfide, bis(4-maleimidophenyl)disulfide, bis[4-(3-maleimidophenoxy)phenyl]sulfide, bis[4-(4-maleimidophenoxy)phenyl]sulfide, bis[4-(3-maleimidophenoxy)phenyl]sulfoxide, bis[4-(4-maleimidophenoxy)phenyl]sulfoxide, bis[4-(3-maleimidophenoxy)phenyl]sulfone, bis[4-(4-maleimidophenoxy)phenyl]sulfone, bis[4-(3-maleimidophenoxy)phenyl]ether, bis[4-(4-maleimidophenoxy)phenyl]ether, 1,4-bis[4-(4-maleimidophenoxy)-α,α-dimethylbenzyl]benzene, 1,3-bis[4-(4-maleimidophenoxy)-α,α-dimethylbenzyl]benzene, 1,4-bis[4-(3-maleimidophenoxy)-α,α-dimethylbenzyl]benzene, 1,3-bis[4-(3-maleimidophenoxy)-α,α-dimethylbenzyl]benzene, 1,4-bis[4-(4-maleimidophenoxy)-3,5-dimethyl-α,α-dimethylbenzyl]benzene, 1,3-bis[4-(4-maleimidophenoxy)-3,5-dimethyl-α,α-dimethylbenzyl]benzene, 1,4-bis[4-(3-maleimidophenoxy)-3,5-dimethyl-α,α-dimethylbenzyl]benzene, 1,3-bis[4-(3-maleimidophenoxy)-3,5-dimethyl-α,α-dimethylbenzyl]benzene, and polyphenylmethane maleimide (for example, a trade name: BMI-2300, manufactured by Daiwa Fine Chemicals Co., Ltd., etc.). These maleimide compounds may be used alone or in combination with two or more thereof.

Among these maleimide compounds, bis(4-maleimidophenyl)methane, bis(4-maleimidophenyl)sulfone, N,N'-(1,3-phenylene)bismaleimide, 2,2-bis(4-(4-maleimidophenoxy)phenyl)propane, and polyphenylmethane maleimide are preferred from the viewpoint of high reactivity and higher heat resistance; and bis(4-maleimidophenyl)methane is especially preferred from the viewpoint of solubility in a solvent.

Examples of the silicone compound having at least one reactive organic group in a molecular structure as the component (B) include a silicone compound containing a structure represented by the following general formula (II):

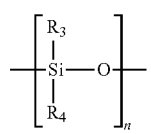

(II)

wherein each of $R_3$ and $R_4$ independently represents an alkyl group, a phenyl group, or a substituted phenyl group; and n represents an integer of 1 to 100.

A silicone compound having at least two reactive organic groups in a molecular structure is suitably used as the component (b); and a silicone compound having reactive organic groups on both ends of the above silicone structure, a silicone compound having a reactive organic group on either end, a silicone compound having a reactive organic group in the side chain, and a silicone compound having a reactive organic group in the side chain and on at least one end are used.

Examples of the reactive organic group in the silicone compound having at least one reactive organic group in a molecular structure of the component (B) include an epoxy group, an amino group, a hydroxyl group, a methacryl group, a mercapto group, a carboxyl group, and an alkoxy group.

As the silicone compound having an epoxy group or epoxy groups in a molecular structure, commercially available products can be used. Examples thereof include products having epoxy groups on both ends, such as "X-22-163" (functional group equivalent weight: 200), "KF-105" (functional group equivalent weight: 490), "X-22-163A" (functional group equivalent weight: 1,000), "X-22-163B" (functional group equivalent weight: 1,750), and "X-22-163C" (functional group equivalent weight: 2,700); products having alicyclic epoxy groups on both ends, such as "X-22-169AS" (functional group equivalent weight: 500) and "X-22-169B" (functional group equivalent weight: 1,700); products having an epoxy group on either end, such as "X-22-1730X" (functional group equivalent weight 4,500); products having epoxy groups in the side chain and on both ends, such as "X-22-9002" (functional group equivalent weight: 5,000); products having an epoxy group in the side chain, such as "X-22-343" (functional group equivalent weight: 525), "KF-101" (functional group equivalent weight: 350), "KF-1001" (functional group equivalent weight: 3,500), "X-22-2000" (functional group equivalent weight: 620), "X-22-4741" (functional group equivalent weight: 2,500), and "KF-1002" (functional group equivalent weight: 4,300); and products having an alicyclic epoxy group in the side chain, such as "X-22-2046" (functional group equivalent weight: 600) and "KF-102" (functional group equivalent weight: 3,600), all of which are manufactured by Shin-Etsu Chemical Co., Ltd. These can be used alone or in combination with two or more thereof, and furthermore, they can be used as a mixture with each epoxy resin.

Among these silicone compounds having an epoxy group or epoxy groups in a molecular structure, "X-22-163A", "X-22-163B", "X-22-343", "X-22-9002", and "KF-101" are preferred from the viewpoint of heat resistance, "X-22-163A" and "X-22-163B" are more preferred; and "X-22-163B" is especially preferred from the viewpoint of low coefficient of thermal expansion.

As the silicone compound having an amino group or amino groups in a molecular structure, commercially available products can be used. Examples thereof include products having amino groups on both ends, such as "KF-8010" (functional group equivalent weight: 430), "X-22-161A" (functional group equivalent weight: 800), "X-22-161B" (functional group equivalent weight: 1,500), "KF-8012" (functional group equivalent weight: 2,200), "KF-8008" (functional group equivalent weight: 5,700), "X-22-9409" (functional group equivalent weight: 700), and "X-22-16603-3" (functional group equivalent weight: 2,200), all of which are manufactured by Shin-Etsu Chemical Co., Ltd., and "BY-16-853U" (functional group equivalent weight: 460), "BY-16-853" (functional group equivalent weight: 650), and "BY-16-853B" (functional group equivalent weight: 2,200), all of which are manufactured by Dow Corning Toray Co., Ltd.; and products having an amino group in the side chain, such as "KF-868" (functional group equivalent weight: 8,800), "KF-865" (functional group equivalent weight: 5,000), "KF-864" (functional group equivalent weight: 3,800), "KF-880" (functional group equivalent weight: 1,800), and "KF-8004" (functional group equivalent weight: 1,500), all of which are manufactured by Shin-Etsu Chemical Co., Ltd. These may be used alone or in combination with two or more thereof.

Among these silicone compounds having an amino group or amino groups in a molecular structure, X-22-161A, X-22-161B, KF-8012, KF-8008, X-22-1660B-3, and BY-16-853B are preferred from the viewpoint of low coefficient of water absorption; and X-22-161A, X-22-161B, and KF-8012 are especially preferred from the viewpoint of low thermal expansion properties.

As the silicone compound having a hydroxyl group or hydroxyl groups in a molecular structure, commercially available products can be used. Examples thereof include products having hydroxyl groups on both ends, such as "KF-6001" (functional group equivalent weight: 900) and "KF-6002" (functional group equivalent weight: 1,600), all of which are manufactured by Shin-Etsu Chemical Co., Ltd.; products having phenolic hydroxyl groups on both ends, such as "X-22-1821" (functional group equivalent weight: 1,470), manufactured by Shin-Etsu Chemical Co., Ltd., and "BY-16-752A" (functional group equivalent weight: 1,500), manufactured by Dow Corning Toray Co., Ltd.; products having a hydroxyl group on either end, such as "X-22-170BX" (functional group equivalent weight: 2,800) and "X-22-170DX" (functional group equivalent weight: 4,670), all of which are manufactured by Shin-Etsu Chemical Co., Ltd.; products having a hydroxyl group in the side chain, such as "X-22-4039" (functional group equivalent weight: 970) and "X-22-4015" (functional group equivalent weight: 1,870), all of which are manufactured by Shin-Etsu Chemical Co., Ltd. These may be used alone or in combination with two or more thereof.

As the silicone compound having a methacryl group or methacryl groups in a molecular structure, commercially available products can be used. Examples thereof include products having methacryl groups on both ends, such as "X-22-164A" (functional group equivalent weight: 860) and "X-22-164B" (functional group equivalent weight: 1,630); and products having a methacryl group on either end, such as "X-22-174DX" (functional group equivalent weight: 4,600), all of which are manufactured by Shin-Etsu Chemical Co., Ltd. These may be used alone or in combination with two or more thereof.

As the silicone compound having a mercapto group or mercapto groups in a molecular structure, commercially available products can be used. Examples thereof include products having mercapto groups on both ends, such as "X-22-167B" (functional group equivalent weight: 1,670); and products having a mercapto group in the side chain, such as "KF-2001" (functional group equivalent weight: 1,900) and "KF-2004" (functional group equivalent weight: 30,000), all of which are manufactured by Shin-Etsu Chemical Co., Ltd. These may be used alone or in combination with two or more thereof.

As the silicone compound having a carboxyl group or carboxyl groups in a molecular structure, commercially available products can be used. Examples thereof include products having carboxyl groups on both ends, such as "X-22-162C" (functional group equivalent weight: 2,300); products having a carboxyl group on either end, such as "X-22-3710" (functional group equivalent weight: 1,450); and products having a carboxyl group in the side chain, such as "X-22-3701E" (functional group equivalent weight: 4,000), all of which are manufactured by Shin-Etsu Chemical Co., Ltd. These may be used alone or by mixing two or more thereof.

As the silicone compound having an alkoxy group or alkoxy groups in a molecular structure, commercially available products can be used. Examples thereof include products having an alkoxy group in the side chain, such as "FZ-3704" (functional group equivalent weight: 150), which is manufactured by Dow Corning Toray Co., Ltd. These may be used alone or by mixing two or more thereof.

The used amount of the component (b) is preferably 1 to 100 parts by mass, and more preferably 5 to 80 parts by mass based on 100 parts by mass of the component (a). When the used amount of the component (b) is 1 part by mass or more, it is possible to realize a low coefficient of thermal expansion. When the used amount of the component (b) is 100 parts by mass or less, adhesion to a copper foil and moldability can be ensured.

It is preferred that the resin composition of the present invention further comprises (c) a thermosetting resin. Although the thermosetting resin as the component (c) is not particularly limited, examples thereof include an epoxy resin, a phenol resin, an unsaturated imide resin, a cyanate resin, an isocyanate resin, a benzoxazine resin, an oxetane resin, an amino resin, an unsaturated polyester resin, an allyl resin, a dicyclopentadiene resin, a silicone resin, a triazine resin, and a melamine resin. These may be used alone or by mixing two or more thereof. Among them, an epoxy resin and a cyanate resin are preferred from the viewpoint of moldability and electric insulating properties.

Examples of the epoxy resin include a bisphenol A type epoxy resin, a bisphenol F type epoxy resin, a bisphenol S type epoxy resin, a phenol novolac type epoxy resin, a cresol novolac type epoxy resin, a bisphenol A novolac type epoxy resin, a bisphenol F novolac type epoxy resin, a stilbene type epoxy resin, a triazine skeleton-containing epoxy resin, a fluorene skeleton-containing epoxy resin, a triphenolphenolmethane type epoxy resin, a biphenyl type epoxy resin, a xylylene type epoxy resin, a biphenyl aralkyl type epoxy resin, a naphthalene type epoxy resin, a dicyclopentadiene type epoxy resin, an alicyclic epoxy resin, a diglycidyl ether compound of a polyfunctional phenol compound or a polycyclic aromatic compound such as anthracene and a phosphorus-containing epoxy resin having a phosphorus compound introduced thereto. These may be used solely or in admixture of two or more kinds thereof. Among them, a biphenyl aralkyl type epoxy resin and a naphthalene type epoxy resin are preferred from the viewpoint of heat resistance and flame retardancy.

Examples of the cyanate resin include a bisphenol type cyanate resin such as a novolac type cyanate resin, a bisphenol A type cyanate resin, a bisphenol E type cyanate resin, and a tetramethylbisphenol F type cyanate resin; and a prepolymer thereof which is partially converted into triazine. These may be used alone or by mixing two or more thereof. Among them, a novolac type cyanate resin is preferred from the viewpoint of heat resistance and flame retardancy.

The used amount of the component (c) is preferably 10 to 200 parts by mass, and more preferably 20 to 100 parts by mass based on 100 parts by mass of the component (a). When the used amount of the component (c) is 10 parts by mass or more, more excellent moisture absorption characteristics and adhesion to a copper foil are obtained. When the used amount of the component (c) is 200 parts by mass or less, heat resistance can be ensured, and it is possible to realize a low coefficient of thermal expansion.

It is preferred that the resin composition of the present invention further comprises, as a component (d), an amine compound having an acidic substituent represented by the following general formula (I).

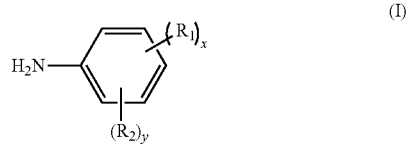

wherein when a plurality of $R_1$s are present, each $R_1$ independently represents a hydroxyl group, a carboxyl group, or a sulfonic acid group as an acidic substituent; when a plurality of $R_2$s are present, each $R_2$ represents a hydrogen atom, an aliphatic hydrocarbon group having a carbon number of 1 to 5, or a halogen atom; x represents an integer of 1 to 5 and y represents an integer of 0 to 4, with the proviso that $x+y=5$.

Examples of the amine compound as the component (d) include m-aminophenol, p-aminophenol, o-aminophenol, p-aminobenzoic acid, m-aminobenzoic acid, o-aminobenzoic acid, o-aminobenzenesulfonic acid, m-aminobenzenesulfonic acid, p-aminobenzenesulfonic acid, 3,5-dihydroxyaniline, and 3,5-dicarboxyaniline. Among them, m-aminophenol, p-aminophenol, o-aminophenol, p-aminobenzoic acid, m-aminobenzoic acid, and 3,5-dihydroxyaniline are preferred from the viewpoint of solubility and synthetic yield; and m-aminophenol and p-aminophenol are more preferred from the viewpoint of heat resistance.

The used amount of the component (d) is preferably 0.1 to 20 parts by mass, and more preferably 1 to 10 parts by mass based on 100 parts by mass of the component (a). When the used amount of the component (d) is 0.1 parts by mass or more, more excellent heat resistance and adhesion to a copper foil are obtained. When the used amount of the component (d) is 20 parts by mass or less, heat resistance can be ensured.

It is preferred to allow the component (d) to react with the component (a) in advance. Although the organic solvent which is used for this reaction is not particularly limited, examples thereof include an alcohol based solvent such as ethanol, propanol, butanol, methyl cellosolve, butyl cellosolve, and propylene glycol monomethyl ether; a ketone based solvent such as acetone, methyl ethyl ketone, methyl isobutyl ketone, and cyclohexanone; an ether based solvent such as tetrahydrofuran; an aromatic solvent such as toluene, xylene, and mesitylene; a nitrogen atom-containing solvent such as methylformamide, dimethylacetamide, and N-methylpyrrolidone; and a sulfur atom-containing solvent such as dimethyl sulfoxide. These can be used alone or by mixing two or more thereof. Among them, cyclohexanone, propylene glycol monomethyl ether, and methyl cellosolve are preferred from the viewpoint of solubility; cyclohexanone and propylene glycol monomethyl ether are more preferred from the viewpoint of low toxicity; and propylene glycol monomethyl ether is especially preferred in view of the fact that it has a high volatility and hardly remains as a residual solvent at the time of manufacturing a prepreg.

Where necessary, a reaction catalyst for the above reaction may be used, and not particularly limited. Examples of the reaction catalyst include amines such as triethylamine, pyridine, and tributylamine; imidazoles such as methyl imidazole and phenyl imidazole; and a phosphorus based catalyst such as triphenyl phosphine. These can be used alone or by mixing two or more thereof.

At the time of allowing the component (a) and the component (d) to react with each other in an organic solvent, a reaction temperature is preferably 70 to 150° C., and more preferably 100 to 130° C. A reaction time is preferably 0.1 to 10 hours, and more preferably 1 to 6 hours.

For the purpose of enhancing heat resistance, flame retardancy, adhesion to a copper foil, and the like, it is desirable to use (e) a curing accelerator in the resin composition of the present invention, and examples of the curing accelerator include imidazoles and derivatives thereof, tertiary amines, a quaternary ammonium salt.

Among them, imidazoles and derivatives thereof are preferred from the viewpoint of heat resistance, flame retardancy, adhesion to a copper foil, and the like. Furthermore, an isocyanate resin represented by the following general formula (III), or a compound substituted with a compound represented by the following general formula (IV), in which an imidazole group is substituted with an epoxy resin is more preferred because of excellent moldability at a relatively low temperature as not higher than 200° C. and excellent long-term stability of a varnish or a prepreg. Specifically, a compound represented by the following formula (V) or (VI) is especially preferred because it may be used in a small blending amount and is commercially inexpensive.

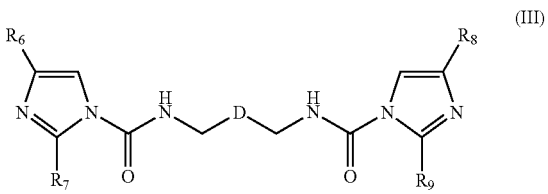

wherein each of $R_6$, $R_7$, $R_8$, and $R_9$ independently represents a hydrogen atom, an aliphatic hydrocarbon group having a carbon number of 1 to 5, or a phenyl group; and D represents an alkylene group or an aromatic hydrocarbon group.

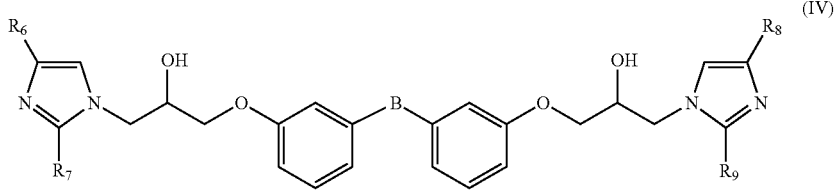

wherein each of $R_6$, $R_7$, $R_8$, and $R_9$ independently represents a hydrogen atom, an aliphatic hydrocarbon group having a carbon number of 1 to 5, or a phenyl group; and B represents any one of an alkylene group, an alkylidene group, an ether group, and a sulfonyl group.

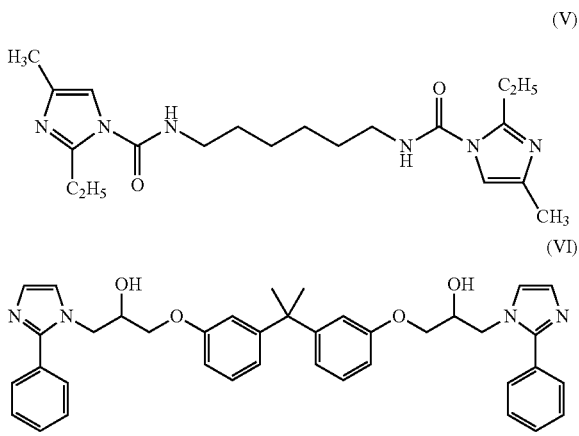

(V)

(VI)

The used amount of the curing accelerator (e) is preferably 0.1 to 10 parts by mass, more preferably 0.1 to 5 parts by mass, and especially preferably 0.1 to 1 part by mass based on 100 parts by mass of the total amount of the components (a) to (d) in terms of solid content. When the used amount of the curing accelerator is 0.1 parts by mass or more, excellent heat resistance, flame retardancy and adhesion to a copper foil are obtained. When it is 10 parts by mass or less, the heat resistance, long-term stability and press moldability are not lowered.

The resin composition of the present invention may optionally comprise (f) an inorganic filler in combination. Examples of the inorganic filler include silica, alumina, talc, mica, kaolin, aluminum hydroxide, boehmite, magnesium hydroxide, zinc borate, zinc stannate, zinc oxide, titanium oxide, boron nitride, calcium carbonate, barium sulfate, aluminum borate, potassium titanate, a glass powder of E-glass, T-glass, D-glass, etc., and a hollow glass bead. These can be used alone or by mixing two or more thereof.

Among these inorganic fillers as the component (f), silica is especially preferred from the viewpoint of dielectric characteristics, heat resistance, and low thermal expansion properties. Examples of the silica include precipitated silica which is manufactured by a wet process and has a high water content; and dry process silica which is manufactured by a dry process and does not substantially contain bonding water. Furthermore, the dry process silica includes crushed silica, fumed silica, and spherical fused silica depending on a difference of the manufacturing method. Among them, spherical fused silica is preferred from the viewpoint of low thermal expansion properties and high fluidity on being filled in the resin.

In the case of using spherical fused silica as the inorganic filler, its average particle size is preferably 0.1 to 10 μm, and more preferably 0.3 to 8 μm. When the average particle size of the spherical fused silica is 0.1 μm or more, the fluidity on being highly-filled in the resin can be kept favorable. When it is 10 μm or less, an incorporation probability of coarse particles is reduced so as to suppress the generation of failure to be caused due to the coarse particles. The average particle size as referred to herein means a particle size which is read off the cumulative distribution curve at the 50% point, with the total volume of particles being 100%, and it can be measured by a laser diffraction-scattering type particle size distribution analyzer and so on.

A content of the inorganic filler (f) is preferably 10 to 300 parts by mass, and more preferably 50 to 250 parts by mass based on 100 parts by mass of the total components (a) to (d) in terms of solid content. When the content of the inorganic filler falls within the range of 10 to 300 parts by mass based on 100 parts by mass of the total resin components, the moldability and low thermal expansion properties of the resin composition can be kept favorable.

In the present invention, known thermoplastic resin, elastomer, flame retarder and organic filler, and the like can be optionally used in combination so far as the object of the invention is adversely affected.

Examples of the thermoplastic resin include polytetrafluoroethylene, polyethylene, polypropylene, polystyrene, a polyphenylene ether resin, a phenoxy resin, a polycarbonate resin, a polyester resin, a polyamide resin, a polyimide resin, a xylene resin, a petroleum resin, and a silicone resin.

Examples of the elastomer include polybutadiene, polyacrylonitrile, epoxy-modified polybutadiene, maleic anhydride-modified polybutadiene, phenol-modified polybutadiene, and carboxy-modified polyacrylonitrile.

Examples of the organic filler include a silicone powder, an organic material powder of tetrafluoroethylene, polyethylene, polypropylene, polystyrene, and polyphenylene ether and so on.

In the present invention, it is also possible to optionally add an ultraviolet ray absorber, an antioxidant, a photopolymerization initiator, a fluorescent brightener, an adhesion improver, etc., and there are no particular limitations. Examples thereof include an ultraviolet ray absorber such as a benzotriazole based material; an antioxidant such as a hindered phenol antioxidant and styrenated phenol; a photopolymerization initiator such as benzophenones, benzyl ketals, and thioxanthone-based type; a fluorescent brightener such as a stilbene derivative; and an adhesion improver such as a urea compound such as urea silane and a silane coupling agent The resin composition of the present invention is used as a varnish at the time of manufacturing a prepreg. The solvent which is used for varnish is the same as the solvent which is used for the above reaction. It is preferred to use the varnish in a solid content concentration of 50 to 75% by mass.

The prepreg of the present invention is obtained by impregnating or coating a substrate with the above-described resin composition of the present invention. The prepreg of the present invention is described in detail below.

The prepreg of the present invention can be manufactured by impregnating or coating a substrate with the resin composition of the present invention, followed by semi-curing (B-staging) by heating for example. As the substrate herein, well-known materials which are used for various laminates for electrical insulating materials can be used. Examples of the material include fibers of an inorganic material such as E-glass, D-glass, S-glass, and Q-glass; fibers of an organic material such as polyimide, polyester, and polytetrafluoroethylene; and mixtures thereof.

Although such a substrate has a form, such as a woven fabric, a unwoven fabric, a roving, a chopped strand mat, and a surfacing mat, the material and the shape are selected depending on an application or a performance of the target molded article, and the material and the shape can be employed alone or in combination with two or more thereof, where necessary. Although the substrate is not particularly limited with respect to its thickness, for example, those having a thickness of about 0.03 to 0.5 mm can be used. Those having been subjected to a surface treatment with a silane coupling agent, etc., or those having been subjected to a mechanical opening treatment are suitable from the vierpoint of heat resistance, moisture resistance, and processability.

The prepreg of the present invention can be obtained by impregnating or coating the substrate with the resin composition in such a manner that an adhesion amount thereof to the substrate is 20 to 90% by mass in terms of a resin content of the prepreg after drying, and then heating for drying usually at a temperature of 100 to 200° C. for 1 to 30 minutes to achieve semi-curing (B-staging).

The laminate plate of the present invention can be formed by laminating and molding the above prepreg of the present invention. The laminate can be, for example, manufactured by such that 1 to 20 sheets of the prepreg of the present invention are superimposed, and a metal foil such as copper and aluminum is disposed on one surface or both surfaces thereof. The metal foil is not particularly limited so far as it is used for an application of electrical insulating materials.

As for a molding condition, for example, methods for a laminate and a multilayered board for electrical insulating material can be applied. The molding can be performed within the temperature range of 100 to 250° C. under a pressure of 0.2 to 10 MPa for a heating time of 0.1 to 5 hours by using a multiplaten press, a multiplaten vacuum press, a continuous molding machine, or an autoclave molding machine, for example. In addition, a laminate can be manufactured by combining the prepreg of the present invention with a wiring board for inner layer and laminating and molding the combination.

The printed wiring board of the present invention is manufactured by forming a circuit on the surface of the laminate. That is, a conductor layer of the laminate according to the present invention is subjected to wiring processing by a usual etching method, and a plurality of the laminates having been subjected to wiring processing are laminated via the above prepreg and then subjected to heat press processing, thereby achieving multilayering in block. Thereafter, a multilayered printed wiring board can be manufactured through the formation of a through-hole or a blind via hole by means of drill processing or laser processing and the formation of an interlayer connection by plating or with an electrically conductive paste.

EXAMPLES

The present invention is described in more detail with reference to the following Examples, but should not be restricted at all.

It should be noted that laminates obtained in the respective Examples and Comparative Examples were used and measured and evaluated with respect to glass transition temperature, coefficient of thermal expansion, solder dip resistance, and warpage characteristics in the following methods.
(1) Measurement of Glass Transition Temperature (Tg):

A substrate for evaluation of 5 mm square was fabricated by dipping a copper clad laminate in a copper etching liquid to remove a copper foil and subjected to thermal mechanical analysis by a compression method using a TMA test apparatus (TMA2940, manufactured by Du Pont). The substrate for evaluation was installed in the apparatus in the Z-direction and then continuously measured twice under a measurement condition at a load of 5 g and at a heating rate of 10° C./min. Tg expressed by a point of intersection of different tangents of a thermal expansion curve in the second measurement was determined and evaluated for heat resistance.
(2) Measurement of Coefficient of Thermal Expansion:

A substrate for evaluation of 5 mm square was fabricated by dipping a copper clad laminate in a copper etching liquid to remove a copper foil and subjected to thermal mechanical analysis by a compression method using a TMA test apparatus (TMA2940, manufactured by Du Pont). The substrate for evaluation was installed in the apparatus in the X-direction and then continuously measured twice under a measurement condition at a load of 5 g and at a heating rate of 10° C./min. An average coefficient of thermal expansion at 30° C. to 100° C. in the second measurement was calculated, and this was defined as a value of the coefficient of thermal expansion.
(3) Evaluation of Solder Heat Resistance:

A copper clad laminate having a size of 5 cm square was fabricated, the substrate for evaluation was floated in a soldering bath at a temperature of 288° C. for one minute, and then an appearance thereof was observed to evaluate the solder heat resistance.
(4) Evaluation of Warpage Amount:

A warpage amount of a substrate was evaluated by means of shadow moire analysis using TherMoire PS200, manufactured by AKROMETRIX. A sample size of the substrate was set to 40 mm×40 mm, and a measuring area was set to 36 mm×36 mm. The sample was heated from room temperature to 260° C. and then cooled to 50° C., thereby measuring the warpage amount.

Examples 1 to 18 and Comparative Examples 1 to 3

Components (a) to (d), (e) a curing accelerator, and (f) an inorganic filler as shown below were mixed in a blending proportion (parts by mass) shown in each of Tables 1 to 5, and methyl ethyl ketone is used as a dilution solvent, thereby obtaining a homogenous varnish having a resin content of 65% by mass.

Subsequently, the above varnish was applied onto an E-glass cloth having a thickness of 0.1 mm, and heat-dried at 160° C. for 10 minutes, thereby obtaining a prepreg having a resin content of 50% by mass.

Four sheets of this prepreg were superimposed, and an 18 μm-thick electrolytic copper foil was disposed on the top and bottom, followed by pressing under a pressure of 2.5 MPa at a temperature of 230° C. for 90 minutes, thereby obtaining a copper clad laminate.

The measurement and evaluation results of the obtained copper clad laminates are shown in Tables 1 to 5.
(a) Maleimide Compound:
  Bis(4-maleimidophenyl)methane
  3,3-Dimethyl-5,5-diethyl-4,4-diphenylmethanebismaleimide
(b) Silicone Compound:
  X-22-161A (duel-end type of amino-modified silicone, functional group equivalent weight: 800, manufactured by Shin-Etsu Chemical Co., Ltd.)
  X-22-161B (duel-end type of amino-modified silicone, functional group equivalent weight: 1,500, manufactured by Shin-Etsu Chemical Co., Ltd.)
  KF-8012 (duel-end type of amino-modified silicone, functional group equivalent weight: 2,200, manufactured by Shin-Etsu Chemical Co., Ltd.)
  KF-864 (single-end type of amino-modified silicone, functional group equivalent weight: 3,800, manufactured by Shin-Etsu Chemical Co., Ltd.)
  X-22-163B (duel-end type of epoxy-modified silicone, functional group equivalent weight: 1,750, manufactured by Shin-Etsu Chemical Co., Ltd.)
  KF-6002 (duel-end type of hydroxyl-modified silicone, functional group equivalent weight: 1,600, manufactured by Shin-Etsu Chemical Co., Ltd.)
  X-22-1821 (duel-end type of phenolic hydroxyl-modified silicone, functional group equivalent weight: 1,470, manufactured by Shin-Etsu Chemical Co., Ltd.)
  X-22-164A (duel-end type of methacryl-modified silicone, functional group equivalent weight: 860, manufactured by Shin-Etsu Chemical Co., Ltd.)

X-22-167B (duel-end type of mercapto-modified silicone, functional group equivalent weight: 1,670, manufactured by Shin-Etsu Chemical Co., Ltd.)

X-22-162C (duel-end type of carboxyl-modified silicone, functional group equivalent weight: 2,300, manufactured by Shin-Etsu Chemical Co., Ltd.)

FZ-3704 (side-chain type of alkoxy-modified silicone, functional group equivalent weight: 150, manufactured by Dow Corning Toray Co., Ltd.)

(c) Thermosetting Resin:
  Biphenyl aralkyl type epoxy resin (NC-3000, manufactured by Nippon Kayaku Co., Ltd.)
  Bisphenol A type cyanate resin (B10, manufactured by Lanza Japan Ltd.)

(d) Amine Compound:
  m-Aminophenol
  p-Aminophenol (e) Curing Accelerator:
  G-8, 009L (an adduct of hexamethylene diisocyanate resin and 2-ethyl-4-methyl imidazole, which is the compound represented by the above formula (V))

(f) Inorganic filler: Fused silica (SO-C2, manufactured by Admatechs Company Limited)

Other Compounds:
  Diaminodiphenylmethane (comparative example)
  2,2-Bis[4-(aminophenoxy)phenyl]propane (comparative example)

TABLE 1

| | Example 1 | Example 2 | Example 3 | Example 4 | Example 5 |
|---|---|---|---|---|---|
| Thermosetting composition (parts by mass) | | | | | |
| (a) Maleimide compound | | | | | |
| Bis(4-maleimidophenyl)methane | 40 | 40 | 40 | 40 | 40 |
| 3,3-Dimethyl-5,5-diethyl-4,4-diphenylmethane bismaleimide | | | | | |
| (b) Silicone compound | | | | | |
| X-22-161A | 15 | 15 | | | |
| X-22-161B | | | 15 | 15 | |
| KF-8012 | | | | | 15 |
| (c) Thermosetting resin | | | | | |
| Biphenyl aralkyl type epoxy resin | 40 | 40 | 40 | 40 | 40 |
| Bisphenol A type cyanate resin | | | | | |
| (d) Amine compound | | | | | |
| m-Aminophenol | 5 | | 5 | | 5 |
| p-Aminophenol | | 5 | | 5 | |
| Curing accelerator | | | | | |
| G-8009L | 0.5 | 0.5 | 0.5 | 0.5 | 0.5 |
| (e) Inorganic filler | | | | | |
| Fused silica | 50 | 50 | 50 | 50 | 50 |
| Performances of laminate | | | | | |
| (1) Glass transition temperature (° C.) | 260 | 260 | 265 | 260 | 265 |
| (2) Coefficient of thermal expansion (ppm/° C.) | 8.5 | 8.5 | 9.0 | 8.5 | 9.0 |
| (3) Solder dip resistance | good | good | good | good | good |
| (4) Warpage amount (μm) | 50 | 45 | 45 | 40 | 45 |

TABLE 2

| | Example 6 | Example 7 | Example 8 | Example 9 | Example 10 |
|---|---|---|---|---|---|
| Thermosetting composition (parts by mass) | | | | | |
| (a) Maleimide compound | | | | | |
| Bis(4-maleimidophenyl)methane | 40 | 40 | 40 | 40 | |
| 3,3-Dimethyl-5,5-diethyl-4,4-diphenylmethane bismaleimide | | | | | 40 |
| (b) Silicone compound | | | | | |
| X-22-161A | 15 | 15 | | | 15 |
| X-22-161B | | | 15 | 15 | |
| KF-8012 | | | | | |
| (c) Thermosetting resin | | | | | |
| Biphenyl aralkyl type epoxy resin | | | | | |
| Bisphenol A type cyanate resin | 40 | 40 | 40 | 40 | 40 |
| (d) Amine compound | | | | | |
| m-Aminophenol | 5 | | 5 | | 5 |
| p-Aminophenol | | 5 | | 5 | |

TABLE 2-continued

|  | Example 6 | Example 7 | Example 8 | Example 9 | Example 10 |
|---|---|---|---|---|---|
| Curing accelerator |  |  |  |  |  |
| G-8009L | 0.5 | 0.5 | 0.5 | 0.5 | 0.5 |
| (e) Inorganic filler |  |  |  |  |  |
| Fused silica | 50 | 50 | 50 | 50 | 50 |
| Performances of laminate |  |  |  |  |  |
| (1) Glass transition temperature (° C.) | 250 | 250 | 250 | 250 | 255 |
| (2) Coefficient of thermal expansion (ppm/° C.) | 8.5 | 8.0 | 8.5 | 8.0 | 8.5 |
| (3) Solder dip resistance | good | good | good | good | good |
| (4) Warpage amount (μm) | 45 | 40 | 40 | 45 | 45 |

TABLE 3

|  | Example 11 | Example 12 | Example 13 | Example 14 | Example 15 |
|---|---|---|---|---|---|
| Thermosetting composition (parts by mass) |  |  |  |  |  |
| (a) Maleimide compound |  |  |  |  |  |
| Bis(4-maleimidophenyl)methane | 40 | 40 | 40 | 40 | 40 |
| 3,3-Dimethyl-5,5-diethyl-4,4-diphenylmethane bismaleimide |  |  |  |  |  |
| (b) Silicone compound |  |  |  |  |  |
| KF-864 | 15 |  |  |  |  |
| X-22-163B |  | 15 |  |  |  |
| KF-6002 |  |  | 15 |  |  |
| X-22-1821 |  |  |  | 15 |  |
| X-22-164A |  |  |  |  | 15 |
| (c) Thermosetting resin |  |  |  |  |  |
| Biphenyl aralkyl type epoxy resin |  |  |  |  |  |
| Bisphenol A type cyanate resin | 40 | 40 | 40 | 40 | 40 |
| (d) Amine compound |  |  |  |  |  |
| m-Aminophenol |  |  |  |  |  |
| p-Aminophenol | 5 | 5 | 5 | 5 | 5 |
| Curing accelerator |  |  |  |  |  |
| G-8009L | 0.5 | 0.5 | 0.5 | 0.5 | 0.5 |
| (e) Inorganic filler |  |  |  |  |  |
| Fused silica | 50 | 50 | 50 | 50 | 50 |
| Performances of laminate |  |  |  |  |  |
| (1) Glass transition temperature (° C.) | 260 | 260 | 260 | 260 | 260 |
| (2) Coefficient of thermal expansion (ppm/° C.) | 8.5 | 8.0 | 8.5 | 8.0 | 8.5 |
| (3) Solder dip resistance | good | good | good | good | good |
| (4) Warpage amount (μm) | 45 | 45 | 40 | 40 | 45 |

TABLE 4

|  | Example 16 | Example 17 | Example 18 |
|---|---|---|---|
| Thermosetting composition (parts by mass) |  |  |  |
| (a) Maleimide compound |  |  |  |
| Bis(4-maleimidophenyl)methane | 40 | 40 | 40 |
| 3,3-Dimethyl-5,5-diethyl-4,4-diphenylmethane bismaleimide |  |  |  |
| (b) Silicone compound |  |  |  |
| X-22-167B | 15 |  |  |
| X-22-162C |  | 15 |  |
| FZ-3704 |  |  | 15 |
| (c) Thermosetting resin |  |  |  |
| Biphenyl aralkyl type epoxy resin |  |  |  |
| Bisphenol A type cyanate resin | 40 | 40 | 40 |
| (d) Amine compound |  |  |  |
| m-Aminophenol |  |  |  |
| p-Aminophenol | 5 | 5 | 5 |
| Curing accelerator |  |  |  |
| G-8009L | 0.5 | 0.5 | 0.5 |
| (e) Inorganic filler |  |  |  |
| Fused silica | 50 | 50 | 50 |

TABLE 4-continued

|  | Example 16 | Example 17 | Example 18 |
|---|---|---|---|
| Performances of laminate |  |  |  |
| (1) Glass transition temperature (° C.) | 260 | 260 | 260 |
| (2) Coefficient of thermal expansion (ppm/° C.) | 8.0 | 8.5 | 9.5 |
| (3) Solder dip resistance | good | good | good |
| (4) Warpage amount (μm) | 45 | 40 | 50 |

TABLE 5

|  | Comparative Example 1 | Comparative Example 2 | Comparative Example 3 |
|---|---|---|---|
| Thermosetting composition (parts by mass) |  |  |  |
| (a) Maleimide compound |  |  |  |
| Bis(4-maleimidophenyl)methane | 40 | 40 |  |
| 3,3-Dimethyl-5,5-diethyl-4,4-diphenylmethane bismaleimide |  |  | 40 |
| (b') Other compound |  |  |  |
| Diaminodiphenylmethane | 15 |  |  |
| 2,2-Bis[4-(aminophenoxy)phenyl]propane |  | 15 | 15 |
| (c) Thermosetting resin |  |  |  |
| Biphenyl aralkyl type epoxy resin |  |  |  |
| Bisphenol A type cyanate resin | 40 | 40 | 40 |
| (d) Amine compound |  |  |  |
| m-Aminophenol | 5 |  | 5 |
| p-Aminophenol |  | 5 |  |
| Curing accelerator |  |  |  |
| G-8009L | 0.5 | 0.5 | 0.5 |
| (e) Inorganic filler |  |  |  |
| Fused silica | 50 | 50 | 50 |
| Performances of laminate |  |  |  |
| (1) Glass transition temperature (° C.) | 260 | 255 | 255 |
| (2) Coefficient of thermal expansion (ppm/° C.) | 11.0 | 10.5 | 11.0 |
| (3) Solder dip resistance | good | good | good |
| (4) Warpage amount (μm) | 75 | 55 | 55 |

As is clear from Tables 1 to 5, the Examples of the present invention are excellent in the glass transition temperature, coefficient of thermal expansion, solder dip resistance, and warpage characteristics. On the other hand, the Comparative Examples are inferior in any one of the glass transition temperature, coefficient of thermal expansion, solder dip resistance, and warpage characteristics to the Examples.

Industrial Applicability

A multi-layered printed wiring board manufactured by using a laminate which is manufactured by laminating and molding a prepreg obtained from the thermosetting resin composition of the present invention is excellent in glass transition temperature, coefficient of thermal expansion, solder dip resistance, and warpage characteristics, and is useful as a highly integrated printed wiring board for electronic devices.

The invention claimed is:

1. A resin composition comprising (a) a maleimide compound having at least two N-substituted maleimide groups in a molecular structure and (b) a silicone compound having at least one reactive organic group in a molecular structure, wherein the reactive organic group of the (b) silicone compound is at least one selected from an epoxy group, an amino group, a hydroxyl group, a methacryl group, a mercapto group, a carboxyl group, and an alkoxy group, wherein the (b) silicone compound is a silicone compound containing a structure represented by general formula (II):

wherein each of $R_3$ and $R_4$ independently represents an alkyl group, a phenyl group, or a substituted phenyl group; and n represents an integer of 1 to 100, and further comprising (d) an amine compound having an acidic substituent represented by general formula (I):

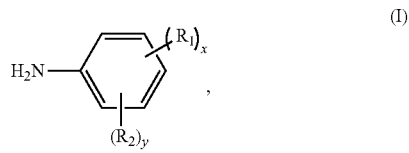

each $R_1$ independently represents a hydroxyl group, a carboxyl group, or a sulfonic acid group as an acidic substituent; each $R_2$ represents a hydrogen atom, an aliphatic hydrocarbon group having a carbon number of 1 to 5, or a halogen atom; and x represents an integer of 1 to 5 and y represents an integer of 0 to 4, with the proviso that x+y=5.

2. The resin composition according to claim 1, further comprising (c) a thermosetting resin.

3. The resin composition according to claim 2, wherein the component (c) is a thermosetting resin having an epoxy group and/or a cyanate group in a molecular structure.

4. The resin composition according to claim 2, further comprising (f) an inorganic filler.

5. The resin composition according to claim 1, wherein the silicone compound has at least two reactive organic groups in a molecular structure.

6. The resin composition according to claim 1, wherein the silicone compound has a reactive organic group on both ends.

7. The resin composition according to claim 1, wherein the silicone compound has a reactive organic group on either end.

8. The resin composition according to claim 1, wherein the silicone compound has a reactive organic group in the side chain.

9. The resin composition according to claim 1, wherein the silicone compound has a reactive organic group in the side chain and on at least one end.

10. The resin composition according to claim 1, further comprising (e) a curing accelerator represented by formula (III) or (IV):

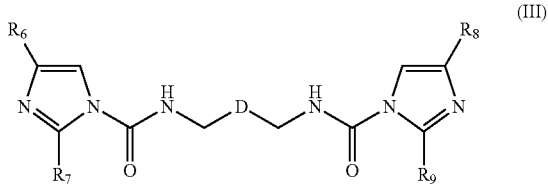

wherein each of $R_6$, $R_7$, $R_8$, and $R_9$ independently represents a hydrogen atom, an aliphatic hydrocarbon group having a carbon number of 1 to 5, or a phenyl group; and D represents an alkylene group or an aromatic hydrocarbon group; and

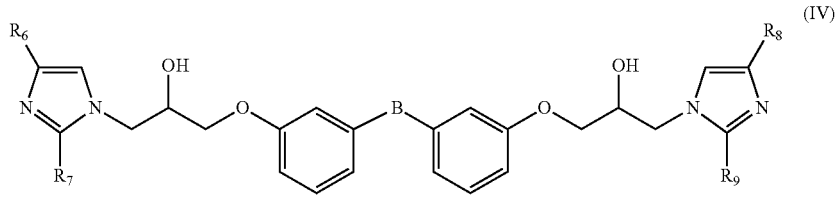

wherein each of $R_6$, $R_7$, $R_8$, and $R_9$ independently represents a hydrogen atom, an aliphatic hydrocarbon group having a carbon number of 1 to 5, or a phenyl group; and B represents single bond or any one of an alkylene group, an alkylidene group, an ether group, and a sulfonyl group.

11. The resin composition according to claim 1, further comprising (f) an inorganic filler.

12. A prepreg manufactured by impregnating or coating a substrate with the resin composition according to claim 1, followed by semi-curing (B-staging) by heating.

13. A laminate plate obtained by laminating and molding the prepreg according to claim 12.

14. A printed wiring board manufactured by forming a circuit on a surface of the laminate plate according to claim 13.

15. The resin composition according to claim 1, which includes 1 to 100 parts by mass of said silicone compound based on 100 parts by mass of said maleimide compound.

16. The resin composition according to claim 15, which includes 0.1 to 20 parts by mass of said amine compound based on 100 parts by mass of said maleimide compound.

* * * * *